United States Patent [19]

Degeneff et al.

[11] Patent Number: 5,781,764
[45] Date of Patent: *Jul. 14, 1998

[54] METHOD AND APPARATUS FOR GENERATION A SYSTEM COMPONENT MODEL AND FOR EVALUATION SYSTEM PARAMETERS IN RELATION TO SUCH MODEL

[75] Inventors: Robert C. Degeneff, Niskayuna; Moises R. Gutierrez, Troy, both of N.Y.

[73] Assignee: ABB Power T & D Company Inc., Raleigh, N.C.

[*] Notice: The term of this patent shall not extend beyond the expiration date of Pat. No. 5,692,158.

[21] Appl. No.: 878,255

[22] Filed: Jun. 18, 1997

Related U.S. Application Data

[63] Continuation of Ser. No. 689,551, Aug. 9, 1996, abandoned, which is a continuation of Ser. No. 332,732, Oct. 13, 1994, abandoned, which is a continuation of Ser. No. 936,828, Aug. 28, 1992, abandoned.

[51] Int. Cl.⁶ ..................................................... G06F 15/00
[52] U.S. Cl. .............................................. 395/500; 364/578
[58] Field of Search ..................... 395/500; 364/488–491, 364/578

[56] References Cited

U.S. PATENT DOCUMENTS

| | | | |
|---|---|---|---|
| 3,883,724 | 5/1975 | Pradhan et al. | 364/495 |
| 5,159,562 | 10/1992 | Putman et al. | 364/494 |
| 5,251,160 | 10/1993 | Rockwood et al. | 364/578 |

OTHER PUBLICATIONS

Degeneff, R.C. et al., "Kron's Reduction Method Applied to the Time Stepping Finite Element Analysis of Induction Machines", *IEEE Trans. on Energy Conversion*, 1995, 10(4), 669–674.

Degeneff, R.C. et al., "Nonlinear, Lumped Parameter Transformer Model Reduction Technique", *IEEE Trans. on Power Delivery*, 1995, 10(2), 862–868.

Degeneff, R.C. et al., "A Method for Constructing Reduced Order Transformer Medels for System Studies from Detailed Lumped Parameter Models", *IEEE*, 1991, 532–538.

Degeneff, R.C. et al., "A Method for Constructing Reduced Order Transformer Medels for System Studies from Detailed Lumped Parameter Models", *IEEE*, 1992, 649–655.

Dommel, "Digital Computer Solution of Electromagnetic Transients in Single and Multiphase Networks", *IEEE Trans. on Power Apparatus and Systems*, 1969, PAS–88 (4), 388–399.

Galarza, R.J. et al., "Transformer Model Reduction Using Time and Frequency Domain Sensitivity Techniques", *IEEE Trans. on Power Delivery*, 1995, 10(2), 1052–1059.

(List continued on next page.)

*Primary Examiner*—Kevin J. Teska
*Assistant Examiner*—Ayni Mohamed
*Attorney, Agent, or Firm*—Woodcock Washburn Kurtz Mackiewicz & Norris, LLP

[57] ABSTRACT

A method for generating a computer model for use in system component design as well as overall system evaluation is disclosed. The method includes the steps of generating an equation model of the system component, modifying the equation model by integrating according to the trapezoidal rule, wherein an integrated model is formed having a plurality of parameter values. Certain of such parameter values define historical parameter values accounting for historical parameter information, the parameter values are arranged in matrix form and reordered. The reorder matrix equation is reduced by eliminating certain of the parameter values, thereby forming a reduced model. When the reduced model is incorporated is a system model it is necessary to modify the system model to account to the component model current parameter information. Such information is used by the component model to update the historical information.

5 Claims, 9 Drawing Sheets

OTHER PUBLICATIONS

Gutierrez, M. et al., "Linear, Lumped Parameter Transformer Model Reduction Technique," *IEEE Trans. on Power Delivery*, 1995, 10(2), 853–861.

Vakilian, M. et al., "Computing the Internal Transient Voltage Response of a Transformer with a Nonlinear Core Using Gear's Method, Part 1: Theory", *IEEE Trans. on Power Delivery*, 1995, 10(4), 1836–1842.

Vakilian, M. et al., "Computing the Internal Transient Voltage Response of a Transformer with a Nonlinear Core Using Gear's Method, Part 2: Verification", *IEEE Trans. on Power Systems*, 1995, 10(2), 702–708.

Vakilian, M. et al., "A Method for Modeling Nonlinear Core Characteristics of Transformers During Transients", *IEEE Trans. on Power Delivery*, 1994, 9(4), 1916–1925.

McNutt, W.J. et al., "Response of Transformer Windings to System Transient Voltages," *IEEE PES Summer Meeting & EHV/UHV Conference, Vancouver, Canada*, Jul. 15–20, 1973, pp. 457–467.

Morched, A. et al., "A High Frequency Transformer Model for EMTP," *IEEE/PES 1992 Summer Meeting*, Paper 92SM 359–0–PWRD, Seattle, Washington, Jul. 12–16, 1992.

Wagenaar, L.B. et al., "Rationale and Implementation of a New 765 kV Generator Step–Up Transformer Specification," *CIGRE*, 1990, 12–202.

DETAILED MODEL
(a)

REDUCED MODEL
(b)

AUTOTRANSFORMER BLOCK DIAGRAM

INPUT REACTANCE vs. FREQUENCY

136 NODE DETAILED TRANSFORMER MODEL:
800 KV METAL OXIDE SURGE ARRESTER (SA),
$R_g = 10^{-4}\ \Omega$, $Z_H = 257\ \Omega$, $Z_X = 285\ \Omega$,
$Z_Y = 30\ \Omega$ FULL WAVE RESPONSE WITH $Zn0$ AT H1
X1 TERMINAL RESPONSE OF DETAILED vs. REDUCED FULL WAVE RESPONSE WITH $Z_nO$ AT H1
Y2 TERMINAL RESPONSE OF DETAILED vs. REDUCED CHOPPED WAVE RESPONSE WITH $Zn0$ AT H1
DETAILED vs. REDUCED

METHOD AND APPARATUS FOR GENERATION A SYSTEM COMPONENT MODEL AND FOR EVALUATION SYSTEM PARAMETERS IN RELATION TO SUCH MODEL

This is a continuation of application Ser. No. 08/689,551, now abandoned, filed Aug. 9, 1996, which is a continuation of Ser. No. 08/322,732, now abandoned, filed Oct. 13, 1994, which is a continuation of Ser. No. 07/936,828, now abandoned filed Aug. 28, 1992.

FIELD OF THE INVENTION

The present invention relates generally to the field of computer based system modelling wherein either a lumped parameter or finite element model is generated and parameter evaluation is made based upon such model. In particular, the invention relates to overall system evaluation or individual component parameter evaluation wherein the component model utilized for such evaluation has been reduced in size and complexity for inclusion as a part of the overall system model.

BACKGROUND OF THE INVENTION

For purposes of illustration, the present invention is described in relation to lumped parameter and finite element systems used to model power transmission systems and components thereof, particularly transformers. This description is intended to illustrate the invention and not to limit application of the invention solely to power transmission systems components. It is noted that the present invention will find application in system evaluations using any type of lumped parameter or finite element model. For example, models used for hydraulic systems, static civil or mechanical systems such as bridges and buildings, and acoustic systems, to name a few, are potential uses for the invention.

High failure rates for EHV transformers of 2.3% per year/phase for 765 Kv GSU's when compared to lower rates for lower voltage units (0.7% per year for 345 Kv GSU's) is of significant concern to the utility industry. As described in L. B. Wagener, et al., *Rationale and Implementation of a New 765 kV Generator Step-up Transformer Specification*, CIGRE, 12-202, August, 1990, considerable effort has been spent investigating the cause of these failures. While no single reason has been identified as the cause of these high failure rates, it has been observed by American Electric Power (AEP) that for its systems over 90% of these failures are related to electrical breakdown of the transformer insulation, i.e., dielectric material, due to effects of transient conditions. Such interest is understandable, when one considers the high cost of these EHV transformers, on the order of several million dollars each.

In order to predict transformer operation in the design phase, i.e. to predict transformer failure under factor test conditions, transformer designers have almost exclusively for the past two decades used a variety of computer based models to determine, i.e., compute, the transformer internal transient voltage response to standard test waveforms. Such computer modeling has included computer models directed to the development of a transformer's dielectric design (both transient and steady state). Many of these models consist of large, multi-nodal networks of linear, lumped, resistances (R), inductances (L), and capacitances (C) parameters, each of which account for losses of varying degree. H. W. Dommel, *Digital Computer Solution of Electromagnetic Transients in Single and Multiphase Networks*, IEEE Transactions on Power Apparatus and Systems, Vol. PAS-88, No. 4, April 1969 described how such a model can be solved mathematically. A standard industry accepted computer program using the Dommel methodology is referred to as an electromagnetic transients program (EMTP). EMPT models have been found to be reasonably accurate for standard lightning and switching impulse tests. Unfortunately, problems can arise when it is desired to evaluate how the final transformer design will operate in a power transmission system.

When performing system studies, i.e. a study of the overall power transmission and distribution system, utility engineers will also utilize computer based models in order to evaluate system operation. In such studies, the utility engineer, similar to the transformer designer, needs to represent the power transformer in some detail. However, it is impractical to incorporate the detailed model used for dielectric design in the system model because of the size and resultant computational burden of the transformer model. Accordingly, utility engineers have used smaller or reduced order models in performing such system studies.

Presently used reduced order models are either generated in relation to transformer terminal characteristics or generated by greatly simplifying the detailed models used in the transformer insulation design. One method of simplifying a detailed electrical model is through use of the Dommel method referenced previously. However, it should be noted that this modeling method has impedance versus frequency characteristics which have been found to be in considerable error when compared to the impedance versus frequency characteristics exhibited by the detailed model. One method for generating a transformer model in relation to terminal characteristics is disclosed in A. Morched, et al. *A High Frequency Transform Model for EMTP*, IEEE Summer Power Meeting, Paper 92SM 359-0-PWRD, Seattle, Wash., July 1992. Unfortunately, one problem with using the terminal characteristic methods is that the resulting model does not allow the interaction of the system and transformer to be fully explored prior to the transformer construction.

The transient waveform which a transmission system places on the transformer is a function of both system characteristics and the transformer impedance characteristic. Therefore, a reduced model which more faithfully represents the impedance characteristic of the transformer is required to perform more realistic system studies. R. C. Degeneff, et al., *A Method for Constructing Reduced Order Transformer Models for System Studies from Detailed Lumped Parameter Models*, IEEE/PES T&D Convention, Dallas Tex., pp. 22-27 presented a method of constructing a reduced order model which allowed the user to select the accuracy bandwidth of the model. The shortcoming of this method is that at high frequencies (e.g., chopped waveforms) the detail that must be retained forces the resultant reduced model to be large which defeats the purpose of the reduction effort.

It will be appreciated from the above that knowledge of a transformer's response to the various voltage waveforms impressed upon it in service is very valuable to the design engineer. If the power engineer could provide the transformer designer with such information early in the design stage, it would improve the final tranformer design, i.e., failure rate, significantly. One method of achieving this result is to have the power and design engineers employ the same detailed transformer model or an equivalent reduced model in both system and design studies. As previously indicated, such a situation is computationally prohibitive.

Consequently, what is needed in the industry is an accurate, wideband, lossy, nonlinear detailed model that can be used by the transformer design engineer, and a corresponding high fidelity, reduced model that can be utilized by the power system engineer but which yields the same test results as the detailed model. As the transformer is one of the most critical components in a modern power distribution system, it is imperative that accurate models of this piece of equipment be available.

The invention presents methods which start with the manufacturer's detailed lumped parameter LRC linear model and systematically reduces it to a size suitable for use in utility system studies. The contribution of this method is that the reduced model's accuracy is identical to the detailed model used in design studies. This allows the utility engineer to develop an accurate picture of the transients at the terminals of the transformer which are a function of both the system and the transformer. This can be accomplished prior to transformer construction allowing the designer time to modify the design in response to more realistic system generated waves.

It is noted that the reduction technique utilized in the present invention is based in part on an extension of the work described in G. Kron, *Diakoptics, The Piecewise Solution of Large-Scale Systems*, MacDonald, London, 1963, in combination with the trapezoidal rule of integration.

SUMMARY OF INVENTION

This invention provides a novel method for generating a computer model for use in system component design as well as overall system evaluation. The method includes the steps of generating an equation model of the system component, modifying the equation model by integrating according to the trapezoidal rule, wherein an integrated model is formed having a plurality of parameter values. Certain of such parameter values define historical parameter values accounting for historical parameter information. The parameter values are arranged in matrix form and reordered. The reorder matrix equation is reduced by eliminating certain of the parameter values, thereby forming a reduced model. When the reduced model is incorporated in a system model it is necessary to modify the system model to account for the component model current parameter information. Such information is used by the component model to update the historical information.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION OF THE INVENTION

Figure 1:
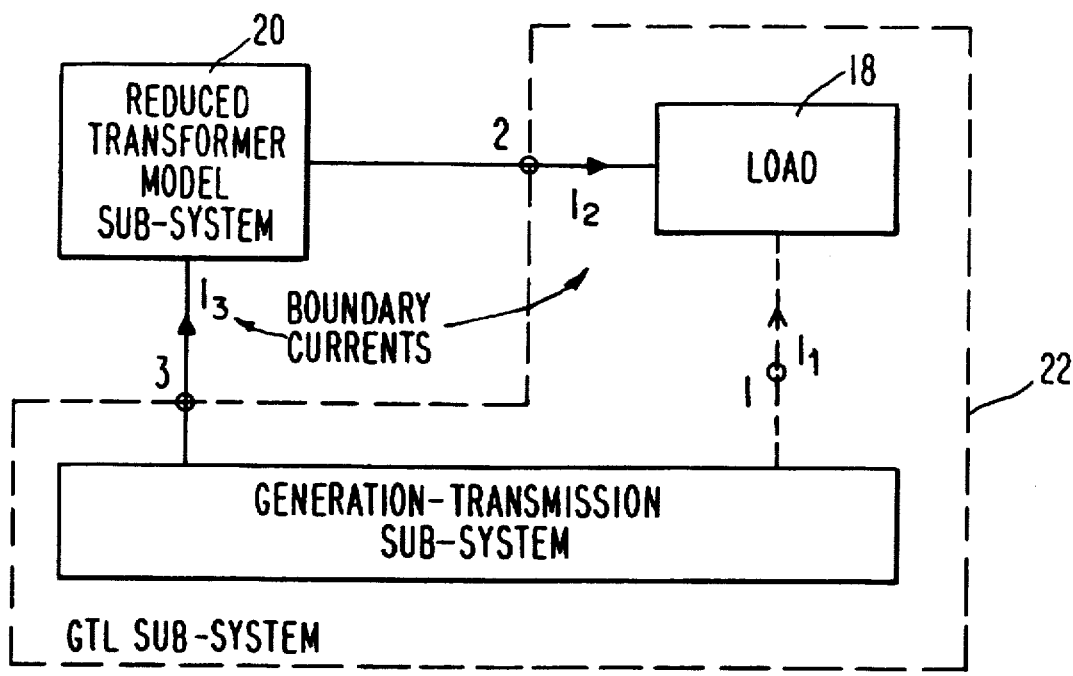
FIG. 1 is a block diagram of a transformer—power transmission system modelled in accordance with the invention.

The ability of a detailed computer model to faithfully reproduce the transient characteristic of a transformer depends upon two independent model characteristics. First, the model must accurately provide R, L, and C representations which are appropriate for the transformer geometry. Second, the model must possess sufficient detail to adequately represent the frequency response of the transformer for the applied waveshape. This last, often overlooked, point can produce results which appear to be mathematically valid, but which may have little physical basis.

The second condition is required to meet the necessary assumption for a valid lumped parameter model that the system must be quasi-static. In other words, the highest frequency for which the network is valid must have a period at least ten times greater than the travel time of the largest element (or division) in the model. It has been noted in W. J. McNutt et al. *Response of Transformer Windings to System Voltages*, IEEE PAS-93, March/April 1972, pp. 457–467 that for a model to predict with reasonable accuracy, the switching surge response it must be valid to at least 10 kHz; 50 kHz for a full wave; and 250 kHz for a chopped wave. It will be recognized that 95% of the energy in the applied wave is contained below these frequencies.

The steady state and transient behavior of a circuit, for any applied voltage, is established by the poles and zeros of the circuit impedance in the complex frequency plane. If a reduced order model of a transformer is to reproduce the transient voltage characteristics of the detailed model, the reduced model must respond with essentially the same poles and zeros in its terminal impedance and transfer function as the complete model over the frequency range of interest. In the past, this relationship has not been emphasized and, if not appreciated, will lead to a conclusion that reduction techniques apply over a much wider frequency range than is, in fact, the case. This has been the most difficult challenge in creating a reduced order model which retains the response characteristic of a detailed model, since, for a static lumped parameter model as the size of the model reduces, the number of valid eigenvalues must also decrease. This makes the static reduced order model intrinsically less accurate.

The reduction technique used in the present invention is based on an extension of Kron's work (identified previously) in combination with the trapezoidal rule of integration. The results which have been obtained include a model having a group of lumped elements and injected currents which are a function of the total transformer topology and past current history. This combination of reduced network elements and injected currents allows a transformer network to be reduced to any degree with no loss of response accuracy. As will be discussed, the results have been compared with the transient voltage response and frequency characteristics of the detailed model used as a reference.

REDUCTION METHOD

For any network of general construction containing linear coupled inductances, resistors, capacitors, and transmission lines, a system of linear equations can be written by preparing a system of differential equations and integrating such equations in accordance with any known method of integration which produces a series of parameter values. In the preferred embodiment, the trapezoidal rule is used. Such equations will describe the function of the nodal voltages and branch currents. Expressing these equations in matrix form leads to:

$$|Y||F(t)|=|i(t)|-|H|; \qquad (1)$$

with:

| $\|Y\|$ | = | Equivalent nodal admittance matrix in the time domain |
| $\|F(t)\|$ | = | Column vector of a function of node voltages |
| $\|i(t)\|$ | = | Column vector of current sources |
| $\|H\|$ | = | Column vector representing the "past history" of the network. |

Equation (1) can have at least three different forms: integral of the voltage $$|\Gamma_n||\phi(t)|=|i(t)|-|H| \qquad (1a)$$

voltage $$|G||v(t)|=|i(t)|-|H| \qquad (1b)$$

differential voltage $$|C||\dot{v}(t)|=|i(t)|-|\hat{H}| \qquad (1c)$$

with:

| $\|\Gamma_n\|$ | = | equivalent inverse nodal inductance matrix |
| $\|G\|$ | = | equivalent nodal conductance matrix |
| $\|C\|$ | = | equivalent nodal capacitance matrix |
| $\|\hat{H}\|, \|H\|, \|\hat{H}\|$ | = | current history vectors for the various formulations | and.

$$|v(t)|=\frac{d}{dt}|\phi(t)| \text{ and } |\dot{v}(t)|=\frac{d}{dt}|v(t)|=\frac{d^2}{dt^2}|\phi(t)|$$

Equation (1b) is the basis for the EMTP, mentioned previously as being described by Dommel. Equation (1a) can form the basis for a transformer time domain transients program. Equation (1c) provides advantage in a network predominately capacitive or in a state variable formulation by combining equations (1b) and 1c).

For purposes of illustrating the invention, the conductance/voltage form will be used, which is consistent with EMTP. However, it should be kept in mind that the results are general and, in fact, the validation results were made with both the integral of voltage formulation and the conductance formulation.

The detailed lumped parameter transformer model can be visualized as an RLC network and can be represented in the time domain by equation (1b) where the equivalent nodal conductance matrix is a function of the time step ($\Delta t$), the nodal capacitance matrix, the nodal conductance matrix and the inverse nodal inductance matrix.

The nodes in the model can be thought of as either internal nodes or boundary nodes. Internal nodes are those which have no external connection and their associated nodal injected current is zero. Boundary nodes are those which connect the transformer to the external circuit, (i.e. transmission system or loads).

The current vector $|i(t)|$ of equation (1b) is relatively sparse since the number of internal nodes is generally larger than the number of boundary nodes, even for three-phase multi-windings transformers. In the present invention, many of the internal nodes from equation (1b) are eliminated. With this reduced model it is possible to reproduce the detailed lumped parameter transformer models response exactly.

Equation (1a) for a power transformer has the following form:

$$\begin{bmatrix} Y_{11} & Y_{12} & Y_{13} \\ Y_{21} & Y_{22} & Y_{23} \\ Y_{31} & Y_{32} & Y_{33} \end{bmatrix} \begin{bmatrix} V_1 \\ V_2 \\ V_3 \end{bmatrix} = \begin{bmatrix} 0 \\ -I_2 \\ I_3 \end{bmatrix} - \begin{bmatrix} H_1 \\ H_2 \\ H_3 \end{bmatrix} \qquad (2)$$

where subscript 1 represents internal nodes to be discarded, subscript 2 represents output nodes to be retained and, subscript 3 represents input nodes to be kept.

The Kron reduction technique is used in the present invention as follows:

First, the equivalent admittance matrix is reordered as follows:

First the matrix and vectors are partitioned:

$$\begin{bmatrix} Y_{22} & Y_{23} & | & Y_{21} \\ Y_{32} & Y_{33} & | & Y_{31} \\ \hline Y_{12} & Y_{13} & | & Y_{11} \end{bmatrix} \begin{bmatrix} V_2 \\ V_3 \\ \hline V_1 \end{bmatrix} = \begin{bmatrix} -I_2 \\ I_3 \\ \hline 0 \end{bmatrix} - \begin{bmatrix} H_2 \\ H_3 \\ \hline H_1 \end{bmatrix} \qquad (A1)$$

Partitioning yields:

$$\begin{bmatrix} Y_{22} & Y_{23} \\ Y_{32} & Y_{33} \end{bmatrix} \begin{bmatrix} V_2 \\ V_3 \end{bmatrix} + \begin{bmatrix} Y_{21} \\ Y_{31} \end{bmatrix} |V_1| = \begin{bmatrix} -I_2 \\ I_3 \end{bmatrix} - \begin{bmatrix} H_2 \\ H_3 \end{bmatrix} \qquad (A2)$$

$$|Y_{12} \, Y_{13}| \begin{bmatrix} V_2 \\ V_3 \end{bmatrix} + [Y_{11}] |V_1| = -|H_1| \qquad (A3)$$

Eliminating $V_1$ yields:

$$|V_1| = -|Y_{11}|^{-1} |Y_{12} \, Y_{13}| \begin{bmatrix} V_2 \\ V_3 \end{bmatrix} = [Y_{11}^{-1}] |H_1|$$

$$\begin{bmatrix} Y_{22} & Y_{23} \\ Y_{32} & Y_{33} \end{bmatrix} \begin{bmatrix} V_2 \\ V_3 \end{bmatrix} +$$

$$\begin{bmatrix} V_{21} \\ V_{31} \end{bmatrix} \left\{ -|Y_{11}|^{-1} |Y_{12} \, Y_{13}| \begin{bmatrix} V_2 \\ V_3 \end{bmatrix} + -|Y_{11}|^{-1} |H_1| \right\} =$$

$$\begin{bmatrix} -I_2 \\ I_3 \end{bmatrix} - \begin{bmatrix} H_2 \\ H_3 \end{bmatrix}$$

$$\left\{ \begin{bmatrix} Y_{22} & Y_{23} \\ Y_{32} & Y_{33} \end{bmatrix} - \begin{bmatrix} Y_{21} \\ Y_{31} \end{bmatrix} |Y_{11}|^{-1} |Y_{12} \, Y_{13}| \right\} \begin{bmatrix} V_2 \\ V_3 \end{bmatrix} =$$

-continued $$\begin{bmatrix} -I_2 \\ I_3 \end{bmatrix} - \left\{ \begin{bmatrix} H_1 \\ H_3 \end{bmatrix} - \begin{bmatrix} Y_{23} \\ Y_{31} \end{bmatrix} |Y_{11}|^{-1} |H_1| \right\}$$

$$\begin{bmatrix} Y_{22} - Y_{21} Y_{11}^{-1} Y_{12} & Y_{23} - Y_{21} Y_{11}^{-1} Y_{13} \\ Y_{32} - Y_{31} Y_{11}^{-1} Y_{12} & Y_{33} - Y_{31} Y_{11}^{-1} Y_{13} \end{bmatrix} \begin{bmatrix} V_2 \\ V_3 \end{bmatrix} \begin{bmatrix} -I_2 \\ I_3 \end{bmatrix} = \quad (3)$$

$$\begin{bmatrix} H_2 - Y_{21} Y_{11}^{-1} H_1 \\ H_3 - Y_{31} Y_{11}^{-1} H_1 \end{bmatrix}$$

Therefore, applying the Kron reduction technique, in accordance with the present invention, to equation (2) yields:

$$\begin{bmatrix} Y_{22} - Y_{21} Y_{11}^{-1} Y_{12} & Y_{23} - Y_{21} Y_{11}^{-1} Y_{13} \\ Y_{32} - Y_{31} Y_{11}^{-1} Y_{12} & Y_{33} - Y_{31} Y_{11}^{-1} Y_{13} \end{bmatrix} \begin{bmatrix} V_2 \\ V_3 \end{bmatrix} = \quad (3)$$

$$\begin{bmatrix} I_2 \\ I_3 \end{bmatrix} - \begin{bmatrix} H_2 - Y_{21} Y_{11}^{-1} H_1 \\ H_3 - Y_{31} Y_{11}^{-1} H_1 \end{bmatrix}$$

Equation (3) represents the reduced model of the power transformer where boundary nodes and select internal nodes are retained. However, the influence of eliminated internal nodes in the response of the transformer is implicit in both the equivalent reduced admittance matrix and the current history vector, so that this reduced model represents accurately the original detailed network exactly. One advantage of this method is that there is no approximation used in the derivation of the reduced model.

This reduction method is suitable for EMTP studies because it represents a network composed of conductances between boundary nodes with time dependent current sources. This network is of the type that is used in EMTP to model any passive lumped parameter networks. The reduced network in equation (3), derived from the equivalent reduced admittance matrix, is only a function of the time step ($\Delta t$), and it is invariant as long as the parameters |C|, |G|, |$\Gamma$| and $\Delta t$ remain unchanged.

Consider next the ability to reduce the transformer model and interface that reduced model with a conventional LRC network model or a system model. FIG. 1 shows a system composed of a geneation system, a transmission system, a transformer (not separately shown and a load 18. It is possible to divide this system into two subsystems, namely, a transformer subsystem 20 and GTL (Generation-Transmission-Load) subsystem 22.

Separating the transformer 20 from the system 22, and replacing it by the boundary currents, it is possible to apply equation (1b) to Generation-Transmission-Load (GTL) subsystem 22, indicated by the area enclosed by the dotted line:

$$\begin{bmatrix} y_{11} & y_{12} & y_{13} \\ y_{21} & y_{22} & y_{23} \\ y_{31} & y_{32} & y_{33} \end{bmatrix} \begin{bmatrix} v_1 \\ v_2 \\ v_3 \end{bmatrix} = \begin{bmatrix} i_1 \\ i_2 \\ -i_3 \end{bmatrix} - \begin{bmatrix} h_1 \\ h_2 \\ h_3 \end{bmatrix} \quad (4)$$

Separating GTL subsystem 22 from the transformer subsystem 20, and replacing it by the boundary currents, the equation for the transformer becomes:

$$\begin{bmatrix} Y_{11} & Y_{12} & Y_{13} \\ Y_{21} & Y_{22} & Y_{23} \\ Y_{31} & Y_{32} & Y_{33} \end{bmatrix} \begin{bmatrix} V_1 \\ V_2 \\ V_3 \end{bmatrix} = \begin{bmatrix} 0 \\ -I_2 \\ I_3 \end{bmatrix} - \begin{bmatrix} H_1 \\ H_2 \\ H_3 \end{bmatrix} \quad (5)$$

where upper case letters represent transformer variables and lower case letters represent variables for the GTL subsystem 22. The adopted sign current convention is current into a node is positive. Note also that boundary currents are equal in magnitude but opposite in sign, and boundary voltage functions (i.e., $v_2=V_2$, $v_3=V_3$) are equal for both subsystems 20 and 22.

By eliminating the internal node voltage function $V_1(t)$ from equation (5) by applying the Kron reduction technique of the present invention, and by eliminating the boundary currents (i.e., $I_2$, $I_3$) by using equation (4), the entire system equation can be obtained as follows:

Applying the equivalent Kron reduction technique to equation (2), we have:

$$\begin{bmatrix} \overline{Y}_{22} & \overline{Y}_{23} \\ \overline{Y}_{32} & \overline{Y}_{33} \end{bmatrix} \begin{bmatrix} V_2 \\ V_3 \end{bmatrix} = \begin{bmatrix} -I_2 \\ I_3 \end{bmatrix} - \begin{bmatrix} \overline{H}_2 \\ \overline{H}_3 \end{bmatrix} \quad (B1)$$

with:

$$\overline{Y}_R = \begin{bmatrix} \overline{Y}_{22} & \overline{Y}_{23} \\ \overline{Y}_{32} & \overline{Y}_{33} \end{bmatrix} = \begin{bmatrix} Y_{22} - Y_{21} Y_{11}^{-1} Y_{12} & Y_{23} - Y_{21} Y_{11}^{-1} Y_{13} \\ Y_{32} - Y_{31} Y_{11}^{-1} Y_{12} & Y_{33} - Y_{31} Y_{11}^{-1} Y_{13} \end{bmatrix}$$

and $$H_R = \begin{bmatrix} \overline{H}_2 \\ \overline{H}_3 \end{bmatrix} = \begin{bmatrix} H_2 - Y_{21} Y_{11}^{-1} H_1 \\ H_3 - Y_{31} Y_{11}^{-1} H_1 \end{bmatrix}$$

$$[y_{11}] |v_1| + [y_{12} \, y_{13}] \begin{bmatrix} v_2 \\ v_3 \end{bmatrix} = |i_1| - |h_1| \quad (B3)$$

$$\begin{bmatrix} y_{21} \\ y_{31} \end{bmatrix} |v_1| + \begin{bmatrix} y_{22} & y_{23} \\ y_{32} & y_{33} \end{bmatrix} \begin{bmatrix} v_2 \\ v_3 \end{bmatrix} = \begin{bmatrix} i_2 \\ -i_3 \end{bmatrix} - \begin{bmatrix} h_2 \\ h_3 \end{bmatrix} \quad (B4)$$

Eliminating the boundary currents between equations B1 and B4 we obtain:

$$\begin{bmatrix} y_{21} \\ y_{31} \end{bmatrix} |v_1| + \begin{bmatrix} y_{22} + \overline{Y}_{22} & y_{23} + \overline{Y}_{23} \\ y_{32} + \overline{Y}_{32} & y_{33} + \overline{Y}_{33} \end{bmatrix} \begin{bmatrix} v_2 \\ v_3 \end{bmatrix} = \begin{bmatrix} h_2 + \overline{H}_2 \\ h_3 + \overline{H}_3 \end{bmatrix} \quad (B5)$$

Combining equation B3 with B5 we have $$\begin{bmatrix} y_{11} & y_{12} & y_{13} \\ y_{21} & y_{22} + \overline{Y}_{22} & y_{23} + \overline{Y}_{23} \\ y_{31} & y_{32} + \overline{Y}_{32} & y_{33} + \overline{Y}_{33} \end{bmatrix} \begin{bmatrix} v_1 \\ v_2 \\ v_3 \end{bmatrix} = \begin{bmatrix} i_1 \\ 0 \\ 0 \end{bmatrix} - \begin{bmatrix} h_1 \\ h_2 + \overline{H}_2 \\ h_3 + \overline{H}_3 \end{bmatrix} \quad (B6)$$

Finally yielding:

$$\begin{bmatrix} y_{11} & y_{12} & y_{13} \\ y_{21} & y_{22} + Y_{22} - Y_{21} Y_{11}^{-1} Y_{12} & y_{23} + Y_{23} - Y_{21} Y_{11}^{-1} Y_{13} \\ y_{31} & y_{32} + Y_{32} - Y_{31} Y_{11}^{-1} Y_{12} & y_{33} + Y_{33} - Y_{31} Y_{11}^{-1} Y_{13} \end{bmatrix} * \quad (6)$$

$$\begin{bmatrix} v_1 \\ v_2 \\ v_3 \end{bmatrix} = \begin{bmatrix} i_1 \\ 0 \\ 0 \end{bmatrix} - \begin{bmatrix} h_1 \\ h_2 + H_2 - Y_{21} Y_{11}^{-1} H_1 \\ h_3 + H_3 - Y_{31} Y_{11}^{-1} H_1 \end{bmatrix}$$

Equation (6) illustrates that the transformer can be represented by its equivalent time-domain reduced model (equation (3)), and used in a more complex system representation. Equation (6) also shows that Generation- Transmission-Load subsystem 22 is modeled in the time domain solution method in the usual manner, and that the reduced but accurate transformer model is just inserted among boundary nodes as an equivalent network with time-dependent current sources.

Figure 2:
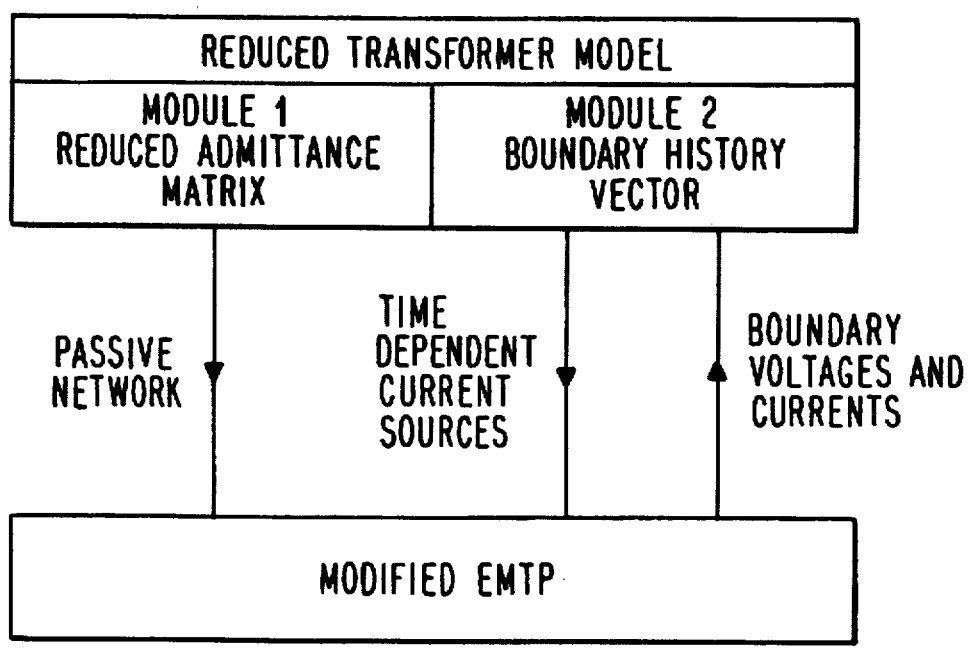
FIG. 2 is a more detailed block diagram of the transformer/system depicted in FIG. 1.

FIG. 2 shows schematically the functional relationship between the modified solution method and the reduced model in the time domain for a power transformer.

Module 1 reduces the detailed admittance matrix by the reduction technique outlined in equations 1–3 and provides a passive network of conductances between boundary nodes. It is a function of the boundary nodes, the time step, the nodal capacitance matrix, the nodal conductance matrix and the inverse nodal inductance matrix. In most cases this computation will be performed once since $\Delta t$ remains constant if the model is linear and time invariant. If the topology of the transformer changes, or the time step changes, the calculation must be repeated.

Module 2 updates history current vector at each time step, once boundary currents or voltages are known, and provides a network of time dependent current sources injected at each boundary nodes from ground. This network is a function of the detailed admittance matrix, and past history.

Past history can be calculated in several ways. The common approach consists of calculating "past history" associated with each branch element as if it were a current source in parallel, by the equations given in the Dommel and Degeneff references identified above. This parallel current source is decomposed into two current sources of the same magnitude but opposite in sign and injected to each branch node element from ground according to the current sign convention. The preferred approach is a matrix approach instead of a branch by branch approach.

The detailed linear lossy lumped parameter transformer (or network) model can be thought of as composed by three subnetworks in parallel: inductance, conductance, and capacitance subnetwork. Each subnetwork is treated independently and its associated injected nodal current vector can be calculated. Adding up all three injected nodal current vectors, the total injected nodal current vector is obtained.

The described nodal equation in EMTP (voltage) form for these subnetworks are indicated in equations C1 through C5 as follows:

Inductance subnetwork:

$$[I_L(t)] = \frac{\Delta t}{2} [T][E(t)] + [H_L(t-\Delta t)] \quad (C1)$$

$$[H_L(t-\Delta t)] = \frac{\Delta t}{2} [T][E(t-\Delta t)] + [I_L(t-\Delta t)] \quad (C2)$$

Conductance subnetwork:

$$[I_R(t)] = [G][E(t)] \quad (C3)$$

Capacitance subnetwork:

$$[I_c(t)] = \frac{2}{\Delta t} [C][E(t)] + [H_c(t-\Delta t)] \quad (C4)$$

$$[H_c(t-\Delta t)] = -\frac{2}{\Delta t} [C][E(t-\Delta t)] - [I_c(t-\Delta t)] \quad (C5)$$

The describing equations of the entire network are shown in equation C6 through C9.

$$[I(t)] = [Y(\Delta t)][E(t)] + [H(t-\Delta t)] \quad (C6)$$

with $$[I(t)] = [I_L(t)] + [I_R(t)] + [I_c(t)] \quad (C7)$$

$$[Y(\Delta t)] = \frac{\Delta t}{2} [T] + [G] + \frac{2}{\Delta t} [C] \quad (C8)$$

$$[H(t-\Delta t)] = [H_L(t-\Delta t)] + [H_c(t-\Delta t)] \quad (C9)$$

Equations C2 and C5 can be arranged as indicated in equation C10 and C11 respectively:

$$[H_L(t-\Delta t)] = 2[I_L(t-\Delta t)] - [H_L(t-2\Delta t)] \quad (C10)$$

$$[H_c(t-\Delta t)] = \frac{-4[C]}{\Delta t} [E(t-\Delta t)] - [H_c(t-\Delta t)] \quad (C11)$$

Equation (C9) can be written as:

$$[H(t-\Delta t)] + [H(t-2\Delta t)] = [H_L(t-\Delta t)] + \quad (C12)$$

$$[H_L(t-2\Delta t)] + [H_c(t-\Delta t)] + [H_c(t-2\Delta t)]$$

substituting equations (C6), (C10), (C12), and (C11) into C12 we have $$[H(t-\Delta t)] = 2[I_L(t-\Delta t)] - \frac{[A_1]}{[I(t-\Delta t)]} + [A_2][H(t-2\Delta t)] \quad (C13)$$

with:

$$[A_1] = \frac{4}{\Delta t} [C][Y^{-1}]$$

$$[A_2] = [A_1] - [1]$$

Replacing equation C2 into C1 and by equation C6 we have:

with:

$$[I_L(t)] = [A_3] \{[I(t)] = [H(t-\Delta t)] +$$

$$[I(t-\Delta t)] + = [H(t-2\Delta t)]\} + [I_L(t-\Delta t)]($$

$$[A_3] = \frac{\Delta t}{2} [T][Y^{-1}]$$

Note that $[A_1]$, $[A_2]$ and $[A_3]$ are constant matrices and are calculated once.

The detailed lumped parameter transformer model is visualized as an RLC network whose initial conditions are determined by the energy of all capacitances and inductances at time equal zero:

$$[E(0)], [I_L(0)] \text{ and } [I(0)];$$

where the injected nodal current of the inductance subnetwork is calculated by equation D1 at t=0

$$[I_L(0)] = [T_{nb}][i(0)] \quad D1$$

with $[T_{nb}]$—connection matrix and $[i(0)]$—winding current segment vector at t=0.

From equation C6 at t=0 we have:

$$[H(-\Delta t)] = [I(0)] - [Y(\Delta t)][E(0)] \quad D2$$

Inserting D2 into C13 at t=$\Delta t$ we have:

$$[H(0)] = 2[I(0)] - [I(0)] - \{(4/\Delta t)[C] - [Y]\}[E(0)] \quad D3$$

In sum a generation-transmission-transformer-load power system can be divided into two subsystems: one consisting of the generation-transmission-load (GTL) model, and the other being the reduced transformer model. Both can be analyzed and solved in parallel by replacing one of the subsystems with the appropriate boundary currents. For EMTP studies, the transformer subsystem can be modeled in a modified version of the EMTP by a passive network of admittances and associated time dependent current sources, whereas the GTL subsystem is modeled in the usual EMTP manner. At the beginning of an EMTP simulation, the admittance matrix for the detailed model is reduced by Module 1, while Module 2 initializes the boundary history vector. This information is passed to the EMTP where it is represented by a passive network of admittances with time dependent current sources. The boundary history vector must be updated at each time step, whereas the reduced admittance matrix is constant as long as the time step and transformer network parameters are constant. Therefore, at the end of each time step, the modified EMTP must pass the instantaneous values of the boundary voltages or currents to Module 2, where it computes the boundary history vector for the next time step and then passes that information back to the EMTP.

ILLUSTRATIVE EXAMPLE

Comparisons have been made between a detailed transformer model used for insulation design and a reduced model of a single-phase, core form, 500 MVA, 765/345/34.5 kV YYD autotransformer, which was constructed by ABB for AEP.

Figure 3:
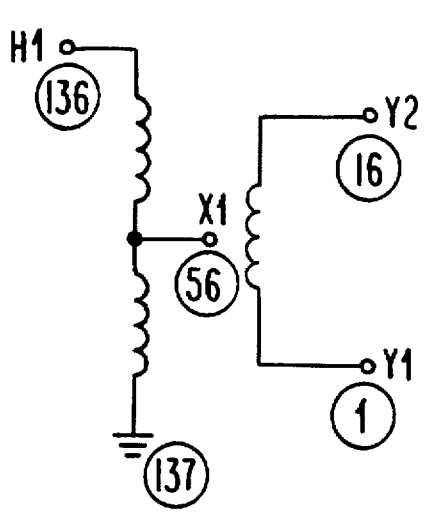
FIG. 3a is a schematic representation of a detailed transformer model.
FIG. 3b is a schematic representation of the transformer model depicted in FIG. 3a reduced in accordance with the invention.
Figure 3:
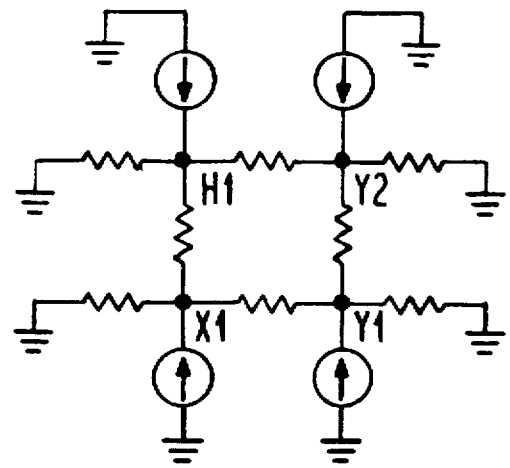

The detailed model is suggested in FIG. 3(a) and it represents a 137 node RLC network. In FIG. 3(b) the reduced transformer model is shown, and consists of a passive network which connects boundary (terminal) nodes with time dependent current sources. This terminal (reduced) transformer model, at most, may provide equivalent transient voltage vs time and impedance vs frequency response when comparisons are made. By comparing the responses of these two models the accuracy of the reduction method can be established. The following comparisons were performed:

Frequency Domain Tests
a) Short circuit admittance functions.
b) Open circuit voltage transfer function.
Time Domain Tests
a) Step function response.
b) Wave responses: full wave, chopped wave, and switching surge wave.

The response comparison between both the detailed and reduced models were performed using the transient analysis program used to design the insulation structure for the transformer. This transient analysis program is similar to EMTP and is based on the same methodology. |4| and |9|. The transient analysis program was modified according to FIG. 2.

Frequency Domain Tests

Specifications require transformer manufacturers to perform short and open circuit tests on power transformers. These tests have been simulated on the detailed and reduced models and the comparison of their responses provides insight into the accuracy of the reduction method.

Figure 4:
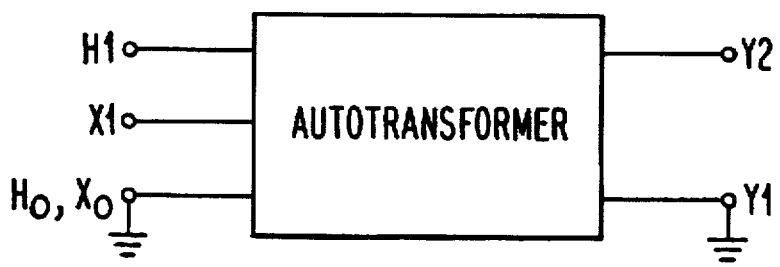
FIG. 4 is a block diagram of an autotransformer.

In FIG. 4 the block diagram for the autotransformer with tertiary is shown. By applying sine waves at terminal H1 at different frequencies, and leaving for instance terminals X1 and Y2 opened, it is possible to compare the responses of the detailed and reduced models at these terminals.

Figure 5:
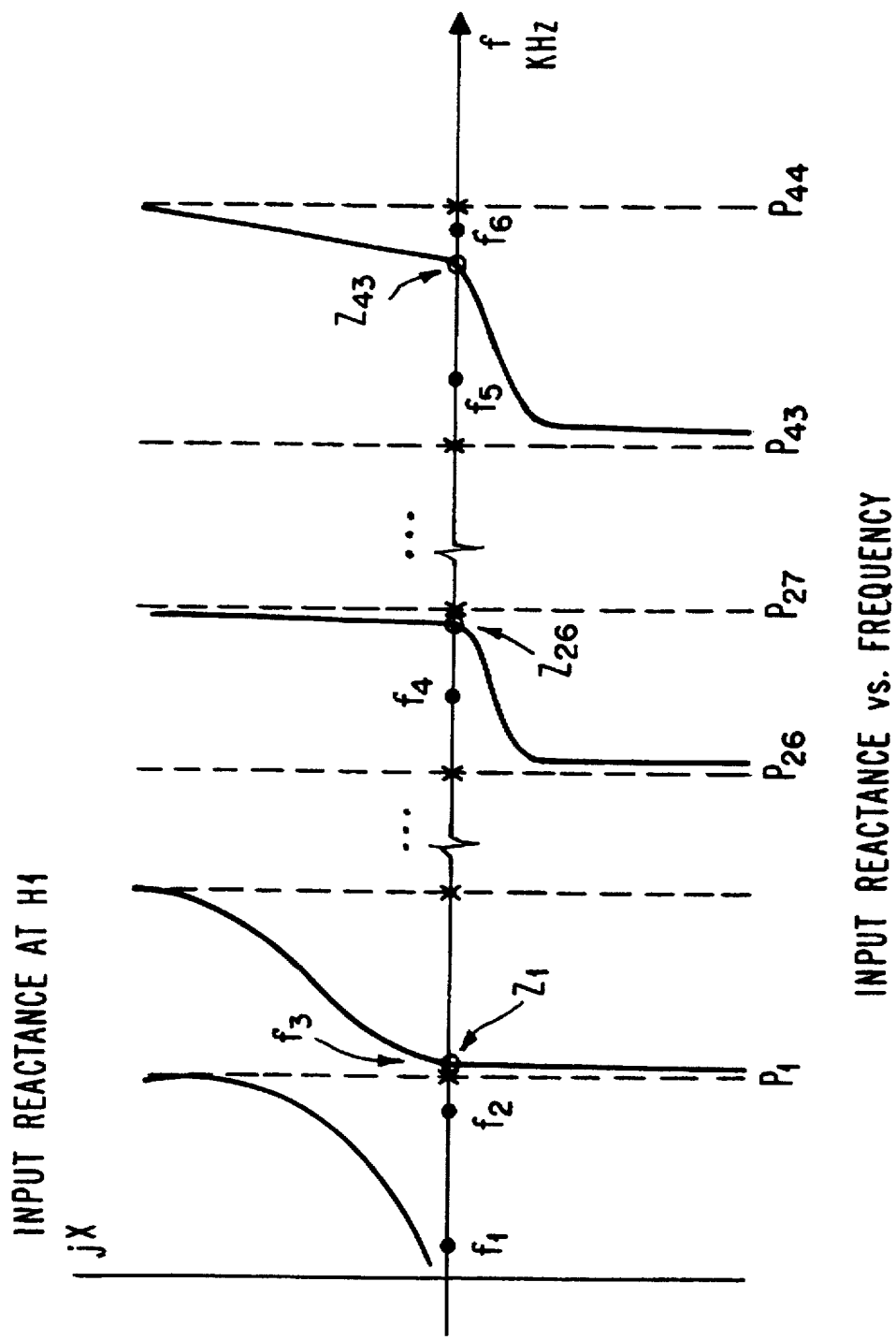
FIG. 5 is a graph of input reactance versus frequency of the short circuit autotransformer depicted in FIG. 4.

FIG. 5 (not to scale) shows the input reactance at terminal H1 as a function of frequency with several poles and zeros below 200 kHz. For instance, the first p1 is located at 1.61 kHz and pole p44 is at 194.39 kHz. The first zero z1 is located very close to pole p1 at 1.61 kHz and the zero z43 occurs at 192.42 kHz |13|.

Six frequencies have been chosen for comparison purposes in the range from 60 Hz to 200 kHz and are indicated in FIG. 5. For instance, f1 is at 60 Hz, and f6 is at 192.5 kHz. It can be seen that f1 and f2 are located where the transformer is predominantly inductive, and frequencies f4 and f5 correspond to a capacitive response. The last test frequency, f6, has been chosen where the input impedance is inductive.

Some results comparing the frequency of the detailed and reduced tests are shown in Tables I and II. In order to demonstrate the capability of the parallel modeling method to handle losses, a dc power loss of 0.3% has been assumed for both models. It should be mentioned that the lack of a more complex damping model in the reduced model is not a shortcoming of this reduction methodology but the starting point, e.g., the detailed model.

Tables I and II show the comparison between the detailed and the reduced model for terminals X1 and Y2, respectively. The relative error is due to numerical errors, round-off and truncation errors, and is less than 0.65% in all observed cases.

TABLE I

| | VX1/VH1 TRANSFER FUNCTION | | |
|---|---|---|---|
| KHZ | DETAILED | REDUCED | ERROR (%) |
| 0.60000000E − 01 | 0.38373880E + 00 | 0.38545940E + 00 | 0.44837811E + 00 |
| 0.15000000E + 01 | 0.38546114E + 00 | 0.38548226E + 00 | 0.54775501E − 02 |
| 0.16100000E + 01 | 0.38745960E + 00 | 0.38548421E + 00 | 0.50983160E + 00 |
| 0.95000000E + 02 | 0.40138317E + 00 | 0.40140805E + 00 | 0.61986172E − 02 |
| 0.18700000E + 03 | 0.40881042E + 00 | 0.40880239E + 00 | 0.19639003E − 02 |
| 0.19250000E + 03 | 0.38566589E + 00 | 0.38565358E + 00 | 0.31918591E − 02 |

TABLE II

VY2/VH1 TRANSFER FUNCTION

| KHZ | DETAILED | REDUCED | ERROR (%) |
|---|---|---|---|
| 0.60000000E – 01 | 0.39913185E – 01 | 0.40134430E – 01 | 0.55431704E + 00 |
| 0.15000000E + 01 | 0.40165008E – 01 | 0.40169920E – 01 | 0.12229499E – 01 |
| 0.16100000E + 01 | 0.40436583E – 01 | 0.40174816E – 01 | 0.64735185E + 00 |
| 0.95000000E + 02 | 0.52279479E – 02 | 0.52271254E – 02 | 0.1573164E – 012 |
| 0.18700000E + 03 | 0.16633057E – 01 | 0.16632217E – 01 | 0.50502676E – 02 |
| 0.19250000E + 03 | 0.184178163 – 01 | 0.18416427E – 01 | 0.75393555E – 02 |

Figure 6:
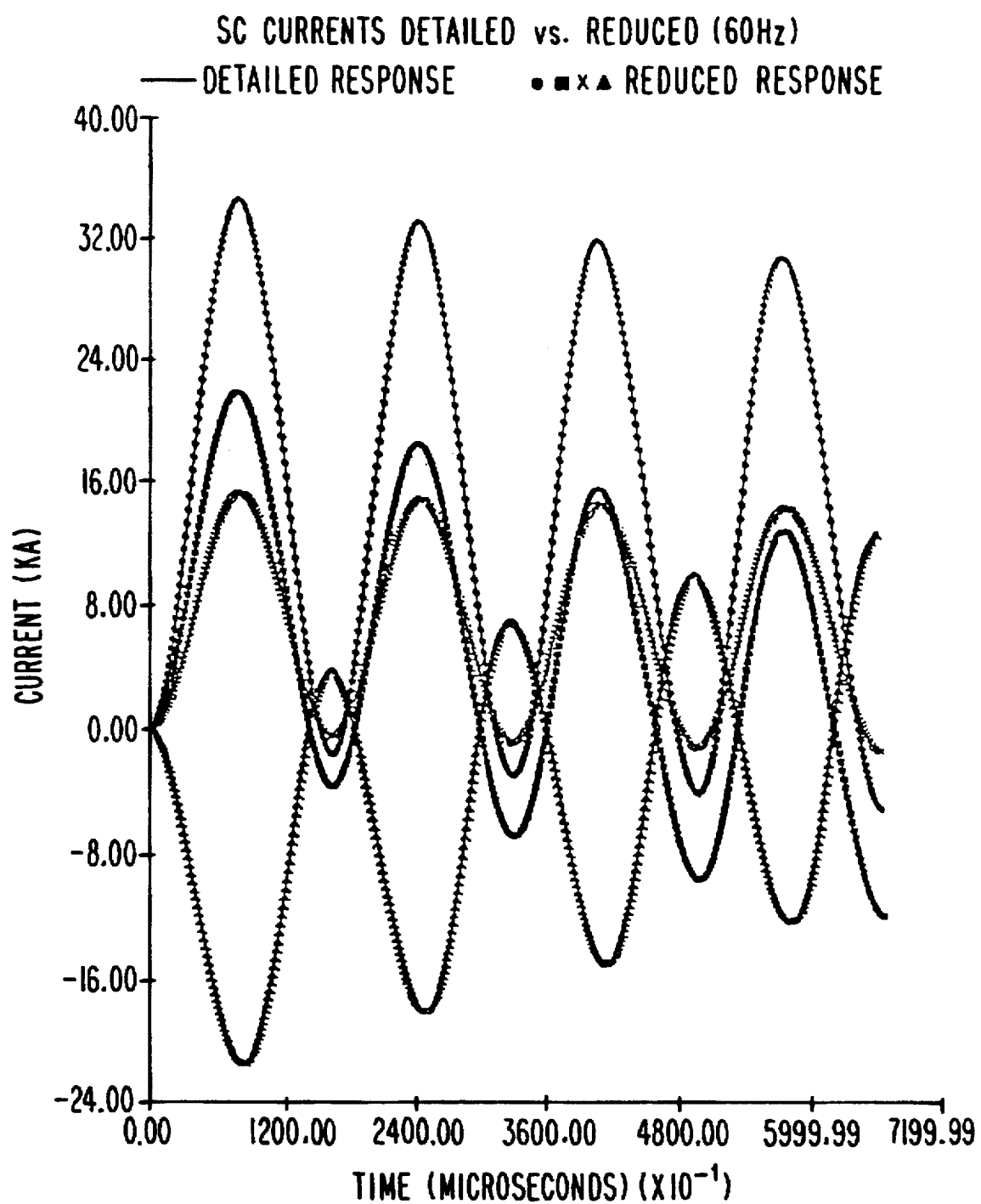
FIG. 6 is a graph of the current response of the detailed transformer model versus the transformer model reduced in accordance with the invention.

FIG. 6 shows the short circuit currents at terminals X1, Y1 and Y2, and the current at H1 for 60 Hz. Out of phase (180°) currents corresponds to tertiary terminals and the highest peak value corresponds to the short circuit current of the common (X1) terminal.

Short circuit currents have been obtained at each of the six test frequencies and the agreement is excellent between the detailed and reduced models.

Time Domain Tests

Figure 7:
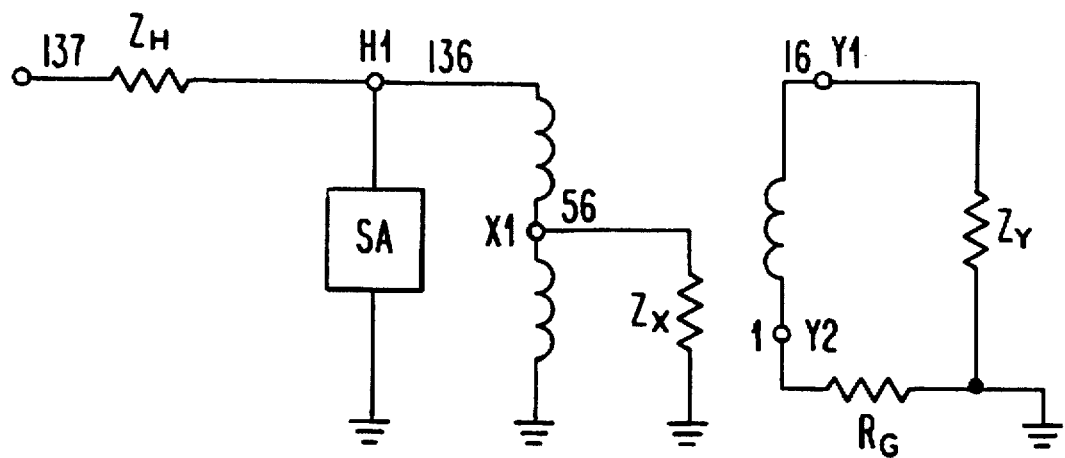
FIG. 7 is a schematic representation of the detailed transformer model which is connected to surge impedance.
Figure 8:
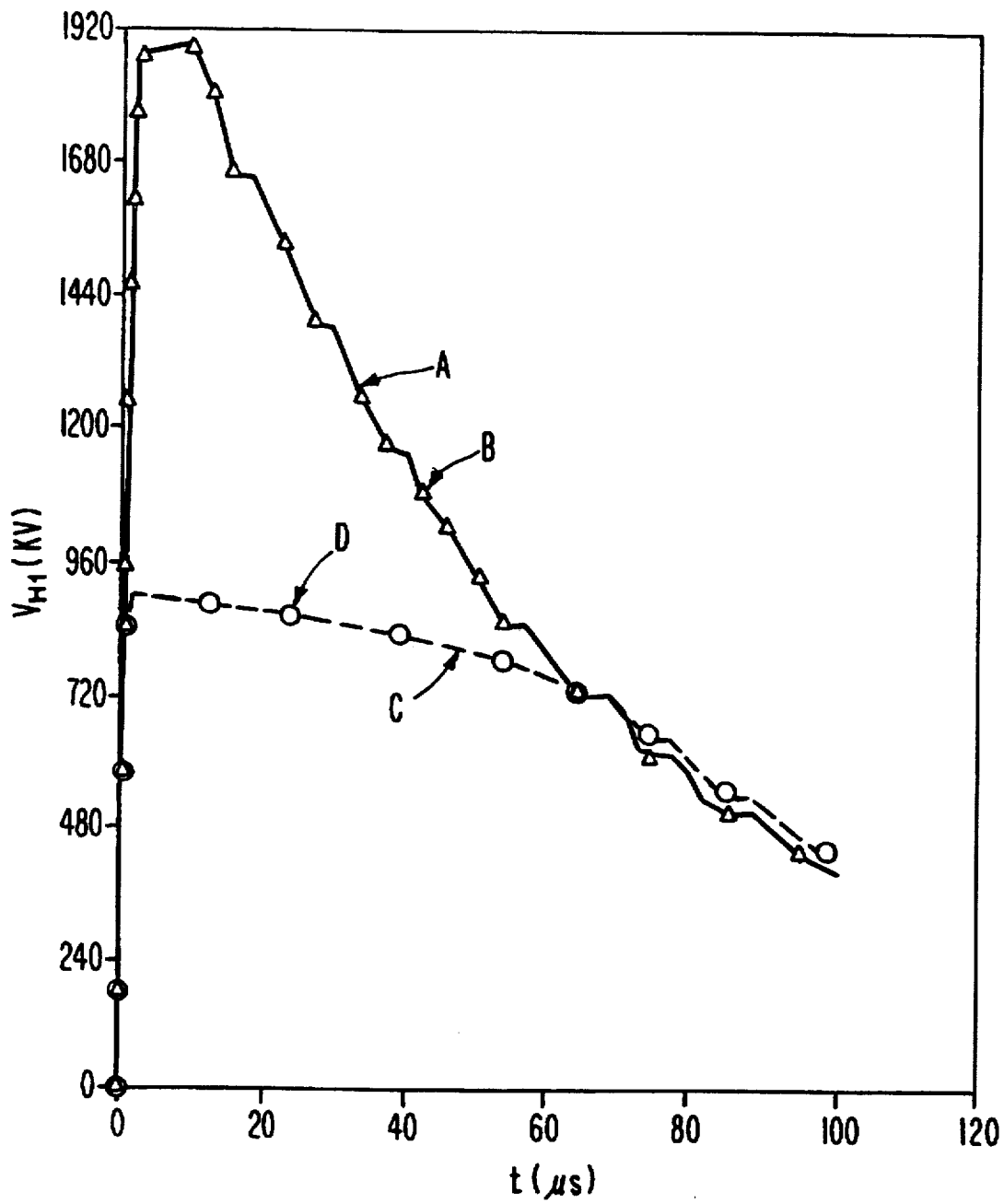
FIG. 8 is a graph showing the difference between detailed and reduced transformer model responses to full wave excitation.
Figure 9:
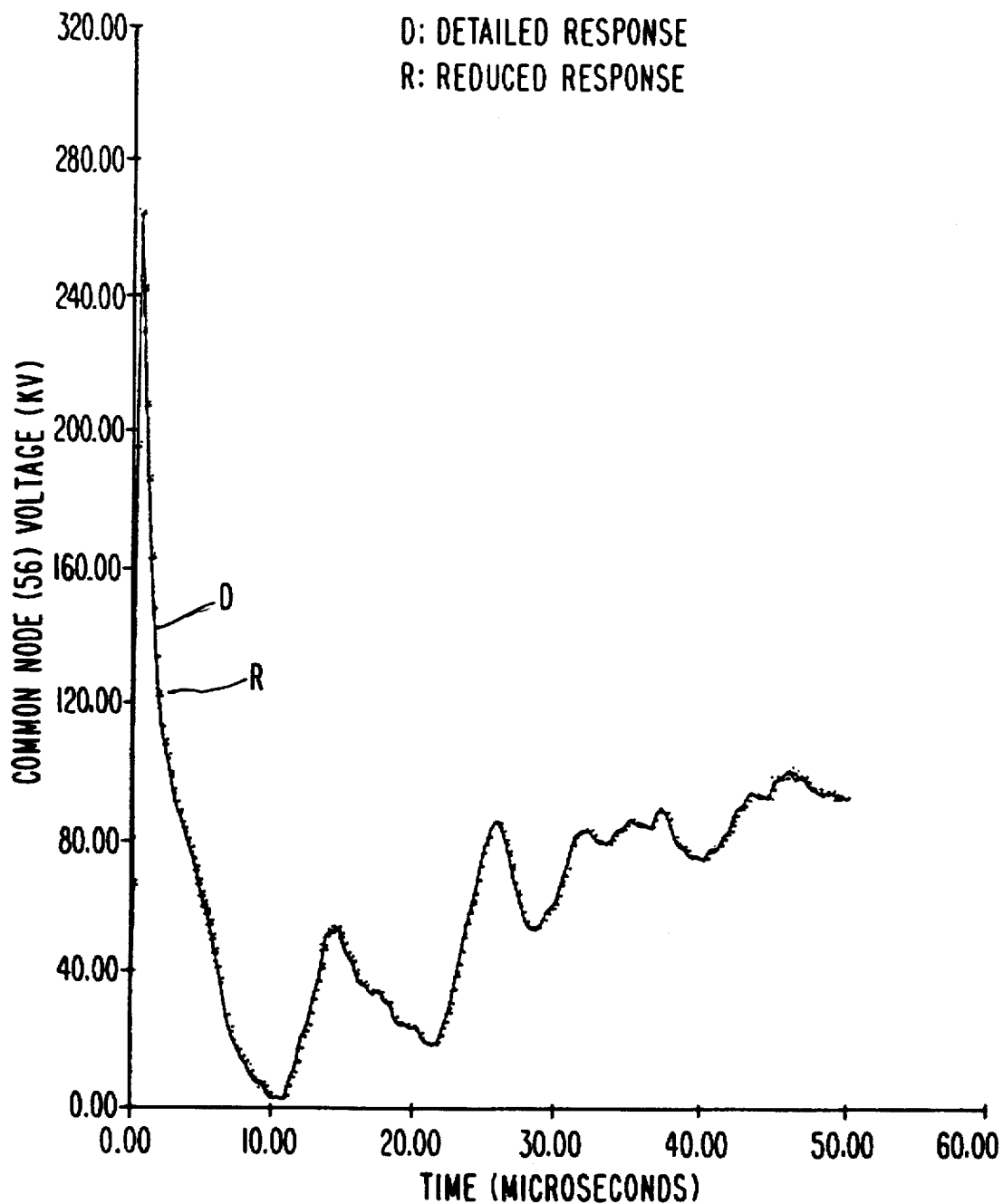
FIG. 9 is a graph showing the difference between detailed and reduced transformer model responses to full wave excitation.
Figure 10:
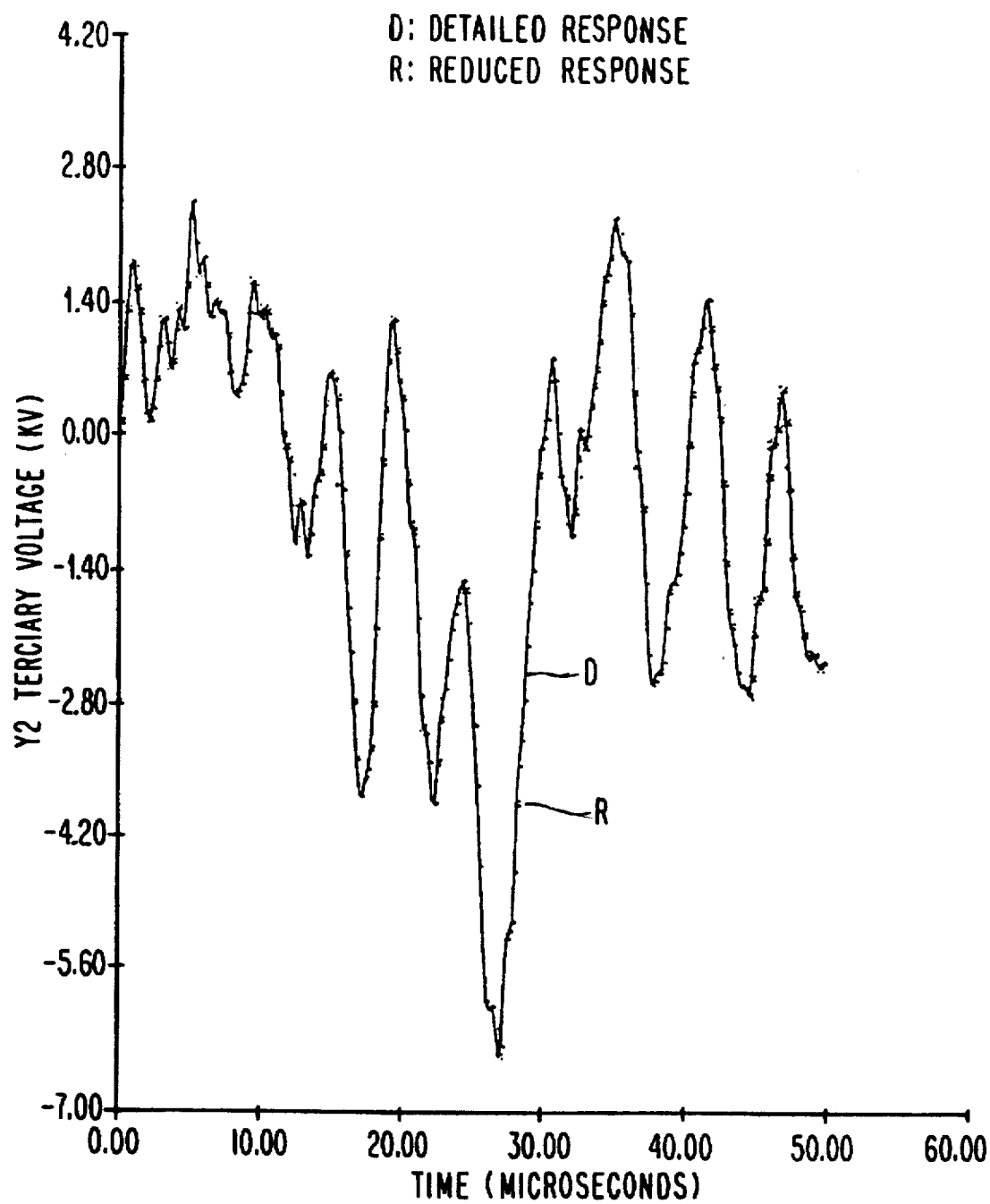
FIG. 10 is a graph showing the difference between detailed and reduced transformer model responses to full wave excitation.

Several transient voltage wave shapes were applied to both the detailed and reduced models. The transformer terminals were connected to surge impedances as indicated in FIG. 7. Additionally, a ZnO lightning arrester was connected at the H1 terminal. The response at node 136 of the detailed and reduced models are compared in FIG. 8 for a standard impulse wave (2050 kV, 1.2/50 µs), applied to node 137. The lower and upper pair of curves corresponds to the response with and without a surge arrester at the high voltage terminal (node 136), respectively. Other terminal responses are compared in FIGS. 9 and 10.

Figure 11:
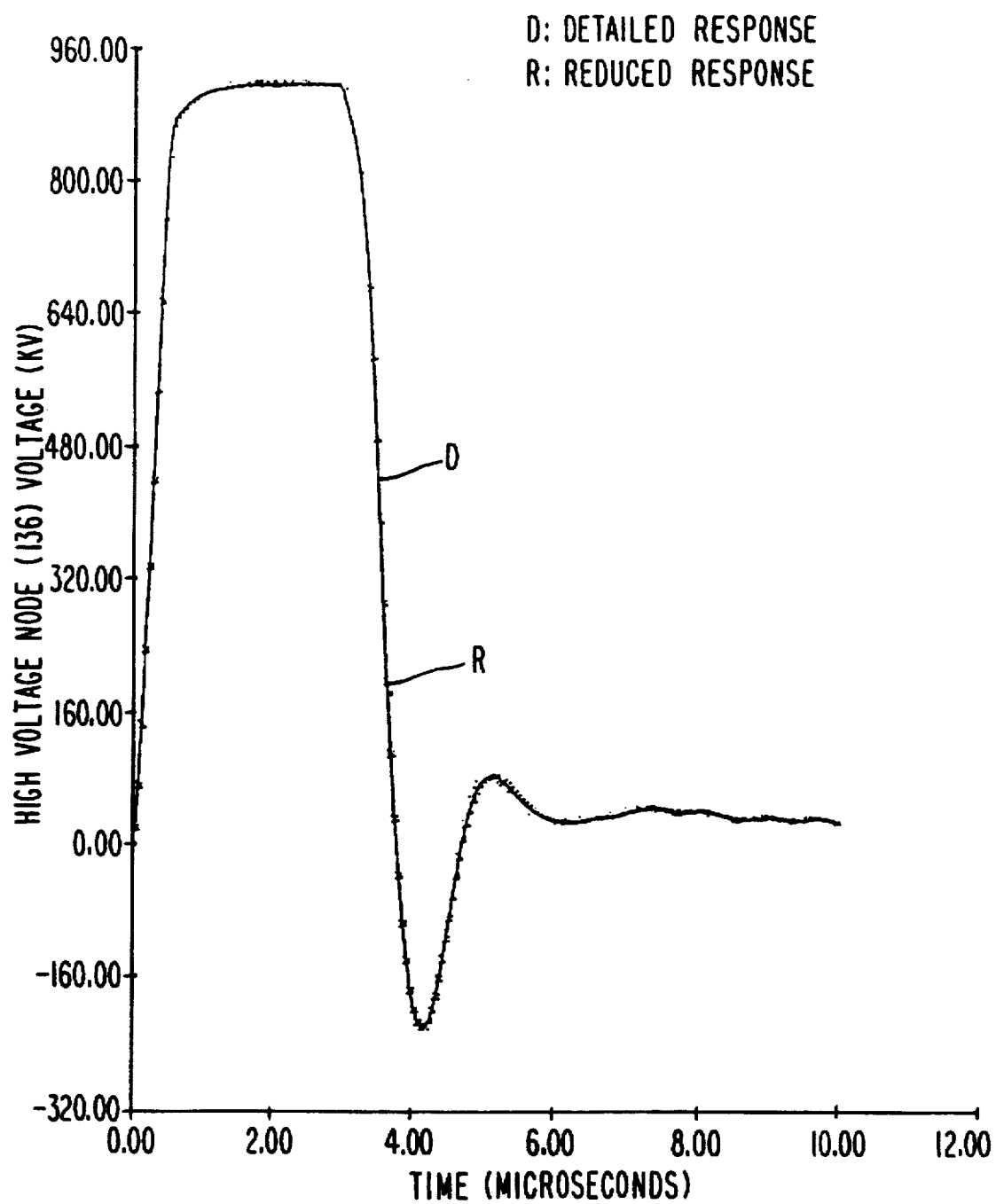
FIG. 11 is a graph showing the difference between detailed and reduced transformer model responses to chopped wave excitation.

FIGS. 11, 12 and 13 show the comparison between the detailed model response and the reduced model response at H1, X1 and Y2 terminals, respectively, when a chopped wave (2250 kV, 1.2/50 µs chopped at 3 µs, the fall time is 0.5 µs and an undershoot of approximately 20%) is applied at node 137. Note that the lightning arrester limits the peak voltage at terminal H1 and the reduced model (cross points) follows exactly the response of the detailed model (solid line). Other wave shapes have been tested with similar agreements.

The method requires only that the retained nodes be specified.

While the invention has been described and illustrated with reference to specific embodiments, those skilled in the art will recognize that modification and variations may be made without departing from the principles of the invention as described herein above and set forth in the following claims.

What is claimed is:

1. A system for generating a reduced computer model of a component of a system for use in analyzing said component, wherein said reduced model is derived on the basis of an equation model of said component, said system comprising:

a computer;

a computer-readable storage medium operatively coupled to said computer and containing:

(1) first code means for modifying said equation model by integrating said equation model, whereby a first matrix model is formed, wherein said first matrix mnodel contains parameter values and is representative of said equation model, and wherein certain of said parameter values define historical parameter values accounting for historical parameter information; and (2) second code means for reordering said parameter values and reducing said first matrix model by eliminating certain of said parameter values, whereby said reduced model is formed; and means for providing input to reduced computer model, said input being repesentative of an excitation signal.

2. The system of claim 1, wherein said first code means for modifying said equation model by integrating said equation model employs the trapezoidal rule of integration.

3. A computer-implemented system for generating a computer model of a linear system for use in analyzing said system, said system comprising:

means for generating a first model of a first portion of said system;

means for generating a second model of a second portion of said system;

means for modifying said first model, to account for historical information of certain parameters of said first portion of said system, thereby forming a modified model;

means for reducing said modified model, thereby forming a reduced model;

means for modifying said second model to provide current information to said first model;

means for incorporating said reduced model into said second model, thereby forming a system model; and means for generating said computer model in response to said system model, said generating including storing said computer model in a computer-readable storage medium.

4. A computer-implemented system for determining an operating parameter of a device in relation to a given input parameter, comprising:

means for generating a lumped parameter model for said device;

means for modifying said lumped parameter model to account for historical information of certain of said parameters, thereby forming a modified model;

means for reducing said modified model by partitioning said model, thereby forming a reduced model;

means for storing computer code representative of said reduced model in a computer-readable storage medium;

means for applying an input parameter to said reduced model; and means for determining said operating parameter.

5. A system for evaluation of a parameter of a system component in relation to the operation of said system component in said system, said system comprising:

means for generating an equation model of said component;

means for modifying said equation model by integrating said equation model according to the trapezoidal rule, thereby forming an integrated model having a plurality of parameter values, wherein certain of said parameter values define historical parameter values accounting for historical parameter information;

means for arranging said integrated model in matrix form thereby forming a matrix model;

means for reordering said parameter values and reducing said matrix model by eliminating certain of said parameter values, thereby forming a reduced model;

means for generating a second computer model of said system;

means for modifying said second model to provide current information to said first model;

means for incorporating said reduced model into said second model, thereby forming a system model;

means for providing input to said system model, said input being representative of an excitation signal; and means for monitoring certain of said parameter values.

* * * * *

UNITED STATES PATENT AND TRADEMARK OFFICE
CERTIFICATE OF CORRECTION

PATENT NO. : 5,781,764

DATED : July 14, 1998

INVENTOR(S) : Robert C. Degeneff et al.

It is certified that error appears in the above-indentified patent and that said Letters Patent is hereby corrected as shown below: Title page, item [54] and col. 1, lines 2-3

IN THE TITLE: "Generation" and " Evaluation" should be --Generating-- and --Evaluating-- as in: --METHOD AND APPARATUS FOR GENERATING A SYSTEM COMPONENT MODEL AND FOR EVALUATING SYSTEM PARAMETERS IN RELATION TO SUCH MODEL--

Col. 3, line 65, before "current response" insert --short circuit--

Col. 7, delete 1$^{st}$ occurrence of equation #3 (lines 5-13).

Col. 7, line 51, close parenthesis after "shown" as in --(not separately shown)--

Col. 10, line 8, "arranged" should be --rearranged--

Col. 10, equation (C10) should be:

$$[H_L (t - \Delta t)] = 2 [I_L (t - \Delta t] - [H_L (t - 2\Delta t)]$$

UNITED STATES PATENT AND TRADEMARK OFFICE
CERTIFICATE OF CORRECTION

PATENT NO. : 5,781,764
DATED : July 14, 1998
INVENTOR(S) : Robert C. Degeneff, et. al.

It is certified that error appears in the above-identified patent and that said Letters Patent is hereby corrected as shown below:

Col. 13, line 66, "mnode" should be -- model --.

Signed and Sealed this

Ninth Day of February, 1999

Attest:

Attesting Officer

*Acting Commissioner of Patents and Trademarks*